United States Patent
Joens

(10) Patent No.: US 7,161,787 B2
(45) Date of Patent: Jan. 9, 2007

(54) LOW POWER SOLENOID DRIVER CIRCUIT

(75) Inventor: Michael Joens, Beverly, MA (US)

(73) Assignee: Millipore Corporation, Billerica, MA (US)

( * ) Notice: Subject to any disclaimer, the term of this patent is extended or adjusted under 35 U.S.C. 154(b) by 0 days.

(21) Appl. No.: 10/838,597

(22) Filed: May 4, 2004

(65) Prior Publication Data
US 2005/0248903 A1    Nov. 10, 2005

(51) Int. Cl.
*H01H 47/04*    (2006.01)
*H01H 47/32*    (2006.01)

(52) U.S. Cl. .................. 361/154; 361/140; 361/160

(58) Field of Classification Search .............. 361/154, 361/140, 160
See application file for complete search history.

(56) References Cited

U.S. PATENT DOCUMENTS

| | | | | |
|---|---|---|---|---|
| 4,112,477 A | * | 9/1978 | Sherwin | 361/155 |
| 4,729,056 A | * | 3/1988 | Edwards et al. | 361/153 |
| 4,745,899 A | * | 5/1988 | Kiuchi et al. | 123/339.22 |
| 4,937,726 A | | 6/1990 | Reustle | 363/56 |
| 5,267,545 A | * | 12/1993 | Kitson | 123/490 |
| 5,364,838 A | * | 11/1994 | Rubsamen | 514/3 |
| 5,404,303 A | * | 4/1995 | Pattantyus et al. | 701/78 |
| 5,480,063 A | | 1/1996 | Keyes et al. | 222/64 |
| 5,680,960 A | | 10/1997 | Keyes et al. | 222/64 |
| 6,031,707 A | * | 2/2000 | Meyer | 361/153 |
| 6,176,277 B1 | * | 1/2001 | Mayer | 141/82 |
| 6,318,818 B1 | * | 11/2001 | Brachert et al. | 303/119.2 |
| 6,623,785 B1 | * | 9/2003 | Childers | 427/2.14 |
| 2002/0191424 A1 | | 12/2002 | Heinke | 363/41 |

FOREIGN PATENT DOCUMENTS

| | | |
|---|---|---|
| EP | 0 091 648 | 10/1983 |
| FR | 81 09486 | 11/1982 |
| WO | 01/48776 | 7/2001 |

\* cited by examiner

*Primary Examiner*—Brian Sircus
*Assistant Examiner*—Zeev Kitz
(74) *Attorney, Agent, or Firm*—Nields & Lemack

(57) ABSTRACT

The present invention provides a system and method for controlling a solenoid that ensures accurate timing between the enabling of the driving circuit and the activation of the solenoid, while simultaneously providing a two energy level driving scheme to reduce power consumption. The present invention utilizes a single enable signal and supplies the solenoid two different energy levels, a higher "set" level and a lower "hold" level. The generation of these two levels is based on the enabling signal and guarantees that the higher "set" level is present when the solenoid is activated, thereby minimizing undesirable timing jitter.

1 Claim, 3 Drawing Sheets

LOW POWER SOLENOID DRIVER CIRCUIT

BACKGROUND OF THE INVENTION

Solenoids are widely used to convert electrical energy into mechanical movement and, due to their utility, are used in a wide range of applications, from time-critical valves to power locks in automobiles to simple doorbells.

Briefly, a solenoid consists of an electrical wire, typically circularly wrapped to create a coil. A magnetically conductive rod is placed inside the coil. When current passes through the coil, a magnetic field is created, which causes the rod to move relative to the coil. In numerous embodiments, a biasing member such as a spring is used to return the rod to its inactive state when the current ceases to flow through the coil.

A simple example of a solenoid is the traditional doorbell. When the user actuates the doorbell, that action connects the coiled wire to the power source, thereby creating a magnetic field within the coiled wire. This field causes a magnetically conductive plunger to move and typically strike a metal tuning plate, which creates the first "ding" sound typically heard. After the doorbell has been released, a biasing member, such as a spring, returns the plunger to its inactive position. In some doorbells, the plunger strikes a second metal tuning plate, creating a second "dong" sound. These same principles apply in more complex applications, such as valves. In that embodiment, the movement of the plunger typically reveals an opening which is normally obstructed by the plunger, thus opening the valve.

Because of the variety of applications, there are a number of different methods of driving these solenoids. In some cases, cost is the most important factor, while in others, power consumption or speed may be the most important factor.

A number of different embodiments of solenoid driver circuits are commercially available. In fact, several manufacturers produce integrated circuits that perform this function in a single chip. To conserve power, some embodiments regulate the amount of current that is driven through the coiled wire. One common technique used to do this is to vary the voltage supplied to the solenoid, using a technique known as "chopping", to insure that the current remains constant. The voltage is varied typically in a sawtooth pattern to limit the current to a predetermined value.

In other embodiments, a dual energy level driving system is used. It is a well-known characteristic of solenoids that the energy needed to activate the solenoid and cause movement of the rod is greater than the energy needed to hold the rod in this active state. As a result, some circuits utilize two different levels of current or voltage to drive solenoids; a first, or higher, level needed to "set" the solenoid and a second, or lower, level needed to "hold" the solenoid.

However, in current embodiments, these power saving mechanisms create uncertainty or jitter in the timing of the solenoid. For example, some applications require a precise relationship between the time that the energy is supplied to the coil and the time that the solenoid is activated. By using a simple circuit, which supplies voltage upon the assertion of a specific enabling signal, this predictability can be obtained, however it is not power efficient.

Circuits that control the current by "chopping" the voltage reduce overall power consumption, but are not as predictable with respect to the time between the enabling of power to the solenoid and the activation of that solenoid, due to the variation in the chopped voltage being supplied to the solenoid.

Similarly, circuits that implement two different voltage or current levels experience timing variation as well. Typically, these circuits use the enabling signal to indicate that the "set" voltage should be applied. Using a conventional timing delay mechanism, the level is later switched to the lower "hold" voltage. However, since the higher level is being applied as the circuit is being enabled, a race condition can occur in which the sequence of the enabling of the circuit and the application of the higher voltage can be indeterminate. In some instances, the higher voltage will be present when the circuit is enabled, resulting in a fast turn-on time. In other instances, the higher voltage will not be present when the circuit is enabled, but will be present some time thereafter, resulting is a somewhat slower turn-on time.

In some applications, a capacitor is charged while the solenoid is in the off position. When the solenoid has to be activated, the capacitor's charge is added to the available supply voltage to ensure rapid switching of the solenoid by creating a high peak current. For this method, timing of the solenoid is only predictable when the pauses between activations are long relative to the capacitor charge rate.

In many applications, the small difference in timing caused by these power-saving mechanisms has no effect on the operation of the system in which the solenoid is being used. However, there are applications, such as time-critical valve control in the fabrication of integrated circuits, where it is imperative that there be a predictable time period between the enabling of the circuit and the activation of the solenoid. In these applications, circuits typically do not employ any power saving techniques because of the unacceptable timing jitter that results.

Therefore, it is an object of the present invention to provide a system and method for controlling a solenoid that minimizes the jitter between the enabling of the circuit and the activation of the solenoid, while implementing a dual energy level driving scheme to reduce power consumption.

SUMMARY OF THE INVENTION

The problems of the prior art have been overcome by the present invention, which provides a system and method for controlling a solenoid that ensures accurate timing while simultaneously providing a dual energy level driving scheme to reduce power consumption. The present invention utilizes a single enable signal and supplies the solenoid two different energy levels, a higher "set" level and a lower "hold" level. The generation of these two levels is based on the enabling signal and guarantees that the higher "set" level is present when the solenoid is activated, thereby minimizing timing jitter.

DETAILED DESCRIPTION OF THE INVENTION

Figure 1:
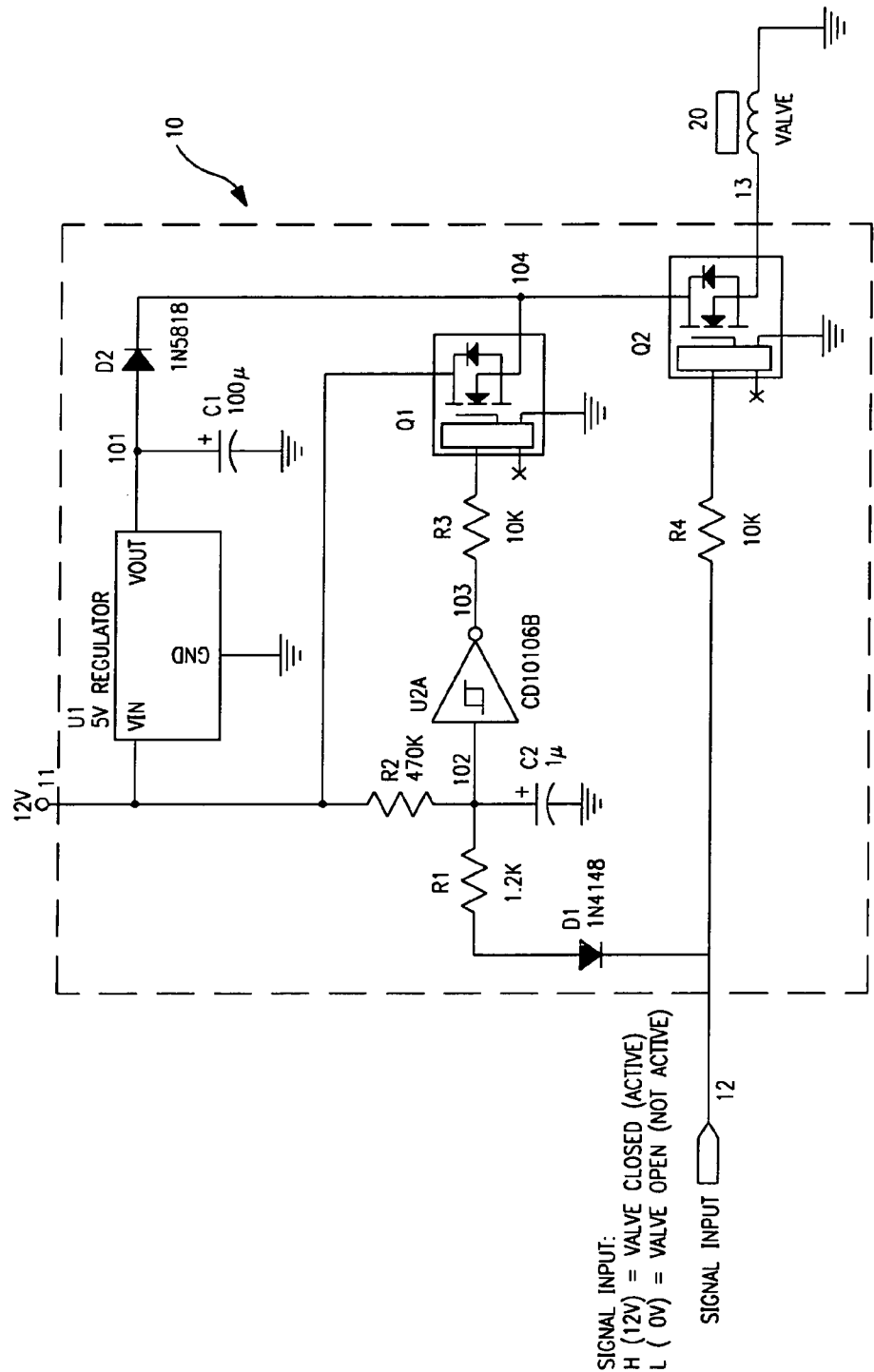
FIG. 1 is a schematic diagram illustrating one embodiment of the present invention.

FIG. 1 is a schematic diagram of the preferred embodiment of the present invention. Variations of this circuit are possible without deviating from the spirit of the invention.

The preferred embodiment of the circuit has a power input 11, a signal input 12 and an output signal 13.

The power input, 11, supplies voltage to the several components in the circuit 10 and to the solenoid 20. Any suitable power source (not shown) can be used to supply the requisite power input to the circuit 10. The amount of voltage supplied also is not particularly limited, and can include 24, 12 and 5 volts and is preferably 12 volts.

The circuit has a single input signal 12 that is used to enable the solenoid 20. In this embodiment, the circuit 10 allows voltage to be passed to the solenoid 20 via the output signal 13 when the enable signal 12 is a logic high. Alternatively, those skilled in the art will appreciate that the circuit can be designed such that the solenoid 20 is powered when the enable signal 12 is a logic low.

The circuit 10 has a single output signal 13 that is in communication with the solenoid 20. The presence of voltage at this output signal 13 allows the solenoid 20 to close, while the absence of voltage at the signal 13 causes the solenoid 20 to open.

In this embodiment, the power input 11 supplies voltage to a voltage regulator U1. This regulator U1 generates the second lower voltage 101 that is used by the solenoid 20 to hold it in the closed position. Capacitor C1 is in communication with the output of the voltage regulator to help improve the stability of the output voltage. While the preferred voltage regulator U1 is a 5V switching regulator with high efficiency to minimize power loss and heat generation, other embodiments are within the scope of the invention. For example, the second lower voltage 101 could be generated using a linear regulator, although the heat generated would be significantly higher. Alternatively, the circuit 10 could have a second power input, created elsewhere in the design, which supplies the lower voltage, without the need to generate it within the circuit.

A diode D2 is in series between the output of the voltage regulator U1 and the input of power switch Q2, with the anode of diode D2 in communication with the voltage regulator U1 and the cathode of diode D2 in communication with the power switch Q2. The cathode of diode D2 is also in communication with the output of power switch Q1, labeled 104. Power switches Q1 and Q2 represent the preferred embodiment, although other implementations are possible. For example, discrete FET transistors, with their associated protection circuitry, could be utilized to perform the same function. In this embodiment, diode D2 is a Schottky diode to minimize forward voltage drop, but any diode can be used to implement this circuit.

The input voltage 11 is also in communication with the input of power switch Q1 and one lead of resistor R2. The opposite lead of resistor R2, labeled 102, is in communication with one lead of resistor R1, capacitor C2 and the input to inverter U2, which preferably has a Schmitt trigger type input.

An inverter with a Schmitt trigger type input is one in which the input voltage at which the output switches in one direction is guaranteed to be measurably higher than the voltage at which the output switches in the other direction. In other words, a typical Schmitt trigger type inverter using a 12 volt supply would cause the output to switch to a low state when the input rises above roughly 7.0 volts. However, the output will not return to the high state until the input drops below roughly 4.7 volts. The difference between these values guarantees that the output of the device will not oscillate while the input voltage is slowly increasing or decreasing.

The other lead of capacitor C2 is connected to ground. The other lead of resistor R1 is in communication with the anode of diode D1.

The output of inverter U2, labeled 103, is in communication with one lead of resistor R3. The opposite lead of resistor R3 is in communication with the enable input of power switch Q1.

Lastly, the cathode of diode D1 is in communication with the input signal 12 and with one lead of resistor R4. The other lead of resistor R4 is in communication with the enable input of power switch Q2. The output of power switch Q2 is in communication with solenoid 20.

The electrical operation of the circuit now will be described with respect to the topology described above.

Assume signal input 12 is in its low state, in which its voltage is at or near 0 volts. This low voltage forces power switch Q2 to be disabled, effectively disconnecting its input from its output. In this condition, the output signal 13 is disabled, with no voltage being applied to it by circuit 10. In addition, the low state of input signal 12 causes current to flow through diode D1 and resistor R1, thereby draining the charge from capacitor C2. At steady state, the voltage at the input to inverter U2 can be expressed as:

$V=0.7V+(12V-0.7V)*R1/(R1+R2)$, where 0.7V is the forward voltage drop across diode D1.

Figure 2:
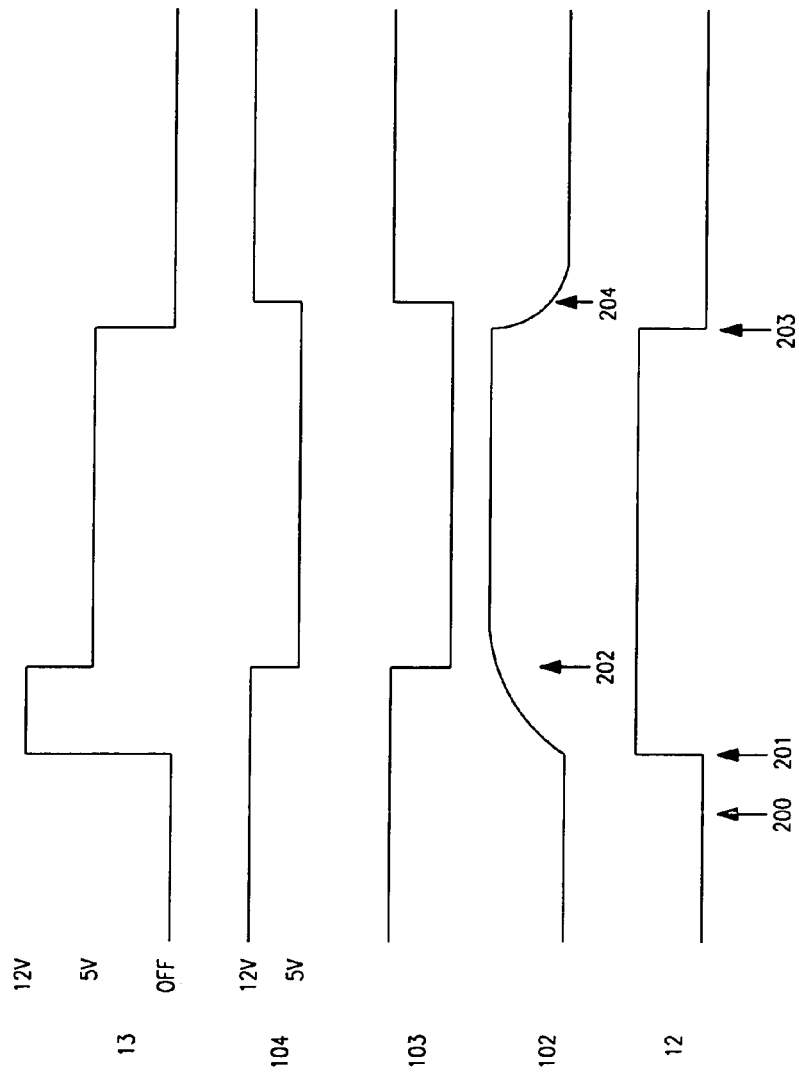
FIG. 2 is a timing diagram illustrating the electrical operation of the present invention.

This voltage 102 at the input of the inverter is sufficiently low to guarantee that the output of inverter U2 will be in the high state, which causes power switch Q2 to be enabled, thereby passing the voltage at its input, 12V, to its output. Since this voltage is much higher than the output of voltage regulator U1, diode D2 does not conduct. Thus, although power switch Q2 is disabled, its input is being supplied with 12V while in the off state. The states of the various voltages in the circuit at this point are shown in FIG. 2, at time 200.

When the input signal 12 switches from 0 volts to 12 volts, power switch Q2 is enabled, thereby passing the voltage at its input to its output. As previously described, its input will be 12 volts when the power switch is first enabled. This is shown at time 201 in FIG. 2.

The high voltage of input signal 12 causes diode D1 to stop conducting current, thereby eliminating the discharge path for capacitor C2. Since diode D1 is no longer conducting, capacitor C2 begins charging, as it receives current from the input voltage via resistor R2. As the capacitor charges, the voltage at the input to inverter U2 increases, at a rate determined by the values of R2 and C2. The charge rate is calculated to be sufficiently long so as to ensure that the higher voltage is applied to the solenoid long enough to bring it fully into the "set" position, including possible mechanical bounce and other phenomena. A charge rate equal to, or greater than, this value is preferable. When the voltage reaches a sufficiently high level, the output of inverter U2 will become low, thereby disabling power switch Q1. Since power switch Q1 is disabled, it no longer supplies the 12 volts signal to its output. Since this voltage is no longer present, diode D2 conducts, allowing the output of the voltage regulator U1 to be placed at the input of power switch Q2. Since power switch Q2 is enabled, this lower voltage flows directly to solenoid 20. This is depicted at time 202 in FIG. 2.

The circuit will remain in this state until the input signal 12 transitions again. When input signal 12 transitions back to the low state, the power switch Q2 will immediately turn off, since it has been disabled, as shown at time 203 in FIG. 2. Diode D1 will begin conducting current, thereby discharging capacitor C2. The rate of discharge is determined by the values of R1 and C2, and will typically be selected to allow rapid discharge of the capacitor while observing the maximum load current rating of the device that is driving the input 11. When the capacitor is sufficiently discharged, the input of inverter U2 is be sufficiently low to cause the output of inverter U2 to transition to its high state, thereby enabling power switch Q1. This allows the input voltage 11 to be delivered to the input of power switch Q2 in preparation for the next transition of input signal 12. This is shown at time 204 in FIG. 2.

While this embodiment utilizes two different voltage levels to set and hold the solenoid, the invention is not limited to only this embodiment. For example, replacing the two voltage levels with two different current sources is within the skill of the art and would achieve the same result.

Figure 3:
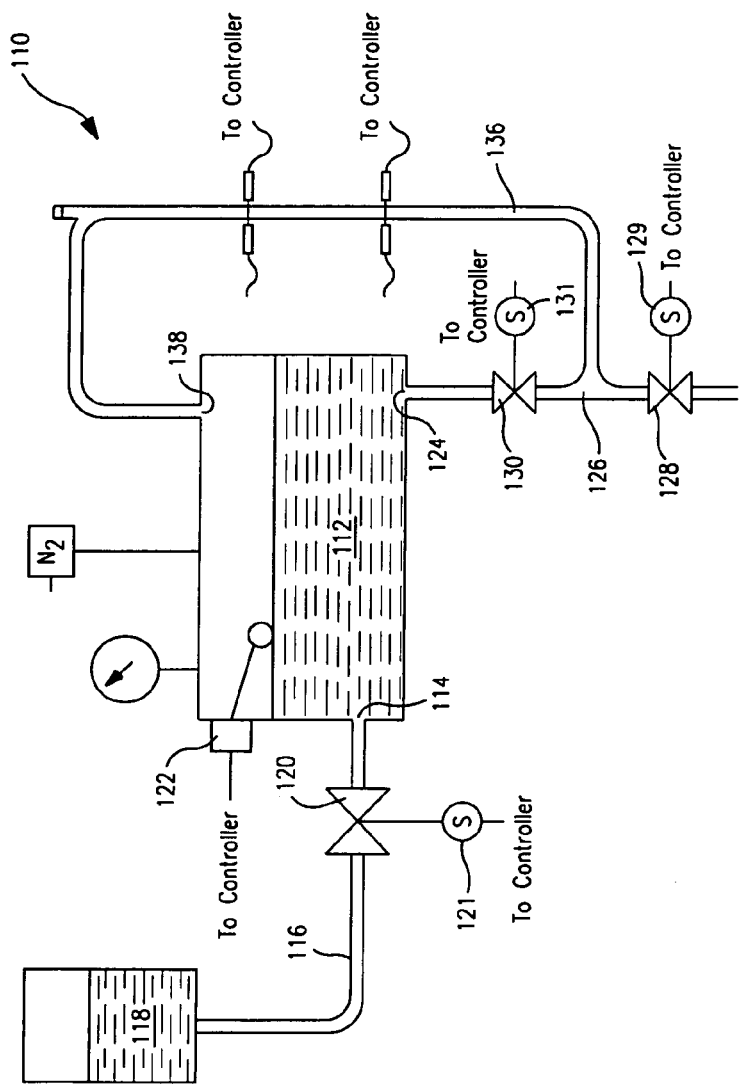
FIG. 3 is a schematic diagram illustrating the pharmaceutical fluid dispensing system of the present invention.

The invention described herein is used in a pharmaceutical fluid dispensing system in which a sterile liquid is measured and dispensed with high accuracy. A representative system is shown in FIG. 3. This system uses a pair of pinch valves to measure liquid volume in a disposable component. These pinch valves are driven by solenoids. Timing of the pinch valves is critical to the application, as it determines the liquid volume. Even small fluctuations can upset the volume to be dispensed. Since solenoid timing is sensitive to the applied voltage, a constant nominal voltage must be applied to activate the valve solenoid. However, since temperature also affects solenoid timing, self-heating of the valves has to be minimized when in the active state. Thus, dual voltage operation becomes necessary.

Since accuracy of valve activation by the solenoid is the overriding criterion, it is imperative that a stable supply voltage is present when needed. Ramp-up delay cannot be tolerated.

In actual implementation of this invention, it has been demonstrated that valve heating can be maintained at a sufficiently low level without any negative impact on valve timing due to voltage switching.

Referring to FIG. 3, there is generally shown at 110 a pharmaceutical fluid dispensing system. System 110 includes a fluid chamber 112, which is filled from the fluid source 118, via supply line 116. A level controller 122 monitors the level of fluid in the chamber 112, and if the level falls below a predetermined threshold, a controller (not shown) opens supply valve 120 by actuating supply solenoid 121.

Chamber 112 contains an outlet 124 and an inlet 138. The controller (not shown) actuates solenoid 131, which in turns opens outlet solenoid 130. Drain tube 126 is in communication with fill tube 136 and drain valve 128. Fill tube 136 forms a closed loop between inlet 138, chamber 112 and outlet 124, thus eliminating the need for venting. The Drain valve 128 controls the precision release of pharmaceutical fluid and is controlled by drain solenoid 129, which is activated by the controller (not shown). Because of the level of precision required, drain solenoid 129 and supply solenoid 131 are driven by the present invention as described in reference to FIG. 1. In the preferred implementation, supply valve 130 and drain valve 128 are integrated with their respective solenoids 131 and 129 in the form of electrically actuated valves.

In the present implementation, this invention is used to drive up to eight valves independently, requiring only one power supply and one regulator. It is a feature of this invention that timing of the voltage switching is independent for each circuit when more than one solenoid has to be operated. Any number of solenoids can be driven by multiplying the circuit accordingly.

Related patents are U.S. Pat. Nos. 5,680,960 and 5,480,063 by Denis Keyes et al, describing a volumetric fluid dispensing apparatus, the disclosures of which are hereby incorporated by reference.

What is claimed is:

1. A pharmaceutical fluid dispensing system, where fluid is dispensed in response to the actuation of a solenoid, and where said solenoid is controlled by a system comprising:

a power switch, having first and second contacts, such that the passage of current between said first and second contacts is determined by the state of an input signal, said second contact in communication with said solenoid, the timing of which is affected by the voltage applied to said solenoid and the temperature of said solenoid, such that the assertion of said input signal allows current to flow through said solenoid; and a circuit for selecting a voltage to be applied to said first contact, said circuit enabling the selection of a first voltage prior to the assertion of said input signal in order to set said solenoid and, after a delay after said assertion, the selection of a second voltage, lower than said first voltage.

* * * * *